United States Patent
Wang et al.

(10) Patent No.: US 9,070,548 B2
(45) Date of Patent: Jun. 30, 2015

(54) METAL HARDMASK COMPOSITIONS

(71) Applicant: Rohm and Haas Electronic Materials LLC, Marlborough, MA (US)

(72) Inventors: Deyan Wang, Hudson, MA (US); Jibin Sun, San Mateo, CA (US); Peter Trefonas, Medway, MA (US); Kathleen M. O'connell, Cumberland, RI (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 35 days.

(21) Appl. No.: 13/776,496

(22) Filed: Feb. 25, 2013

(65) Prior Publication Data
US 2013/0337179 A1 Dec. 19, 2013

Related U.S. Application Data

(60) Provisional application No. 61/607,035, filed on Mar. 6, 2012.

(51) Int. Cl.
*H01L 21/02* (2006.01)
*C08K 5/00* (2006.01)
*H01L 21/027* (2006.01)
*H01L 21/033* (2006.01)

(52) U.S. Cl.
CPC ........ *H01L 21/02002* (2013.01); *C08K 5/0091* (2013.01); *H01L 21/0271* (2013.01); *H01L 21/0332* (2013.01)

(58) Field of Classification Search
None
See application file for complete search history.

(56) References Cited

U.S. PATENT DOCUMENTS

| | | | |
|---|---|---|---|
| 5,100,503 A | 3/1992 | Allman et al. | |
| 6,197,896 B1 * | 3/2001 | Aviram et al. | 525/370 |
| 6,303,270 B1 | 10/2001 | Flaim et al. | |
| 6,740,469 B2 | 5/2004 | Krishnamurthy et al. | |
| 2007/0238052 A1 | 10/2007 | Zampini et al. | |
| 2009/0148789 A1 | 6/2009 | Amara et al. | |

FOREIGN PATENT DOCUMENTS

| | | |
|---|---|---|
| WO | 2004/065428 A2 | 8/2004 |
| WO | 2007/053396 A2 | 5/2007 |

OTHER PUBLICATIONS

Di Maggio et al. (Chem. Mater. 1998, 10, 1777-1784).*
Yang et al. (J. Mater. Chem. 2005, 15, 4200-4202).*
Yubao Wang et al. (Proc. SPIE 5724, Organic Photonic Materials and Devices VII, 42, Apr. 11, 2005, 42-49).*
Chen et al., Material Chemistry and Physics, 83 (2004), 71-77.

* cited by examiner

Primary Examiner — Vu A Nguyen

(57) ABSTRACT

The invention provides a composition comprising at least the following A and B:
A) a polymer comprising, in polymerized from, at least one "monomer that comprises at least one hydroxyl group;" and
B) an organometal compound comprising at least one metal selected from Ti, Zr, Hf, Co, Mn, Zn, or combinations thereof, and wherein the organometal compound is present in an amount greater than 5 weight percent, based on the sum weight of A and B.

20 Claims, 8 Drawing Sheets

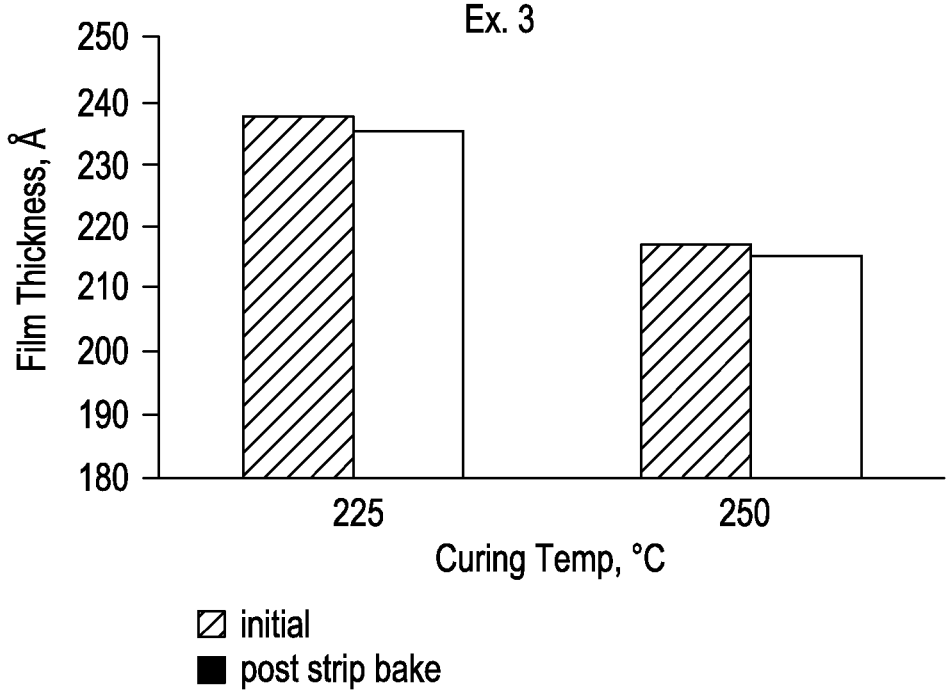
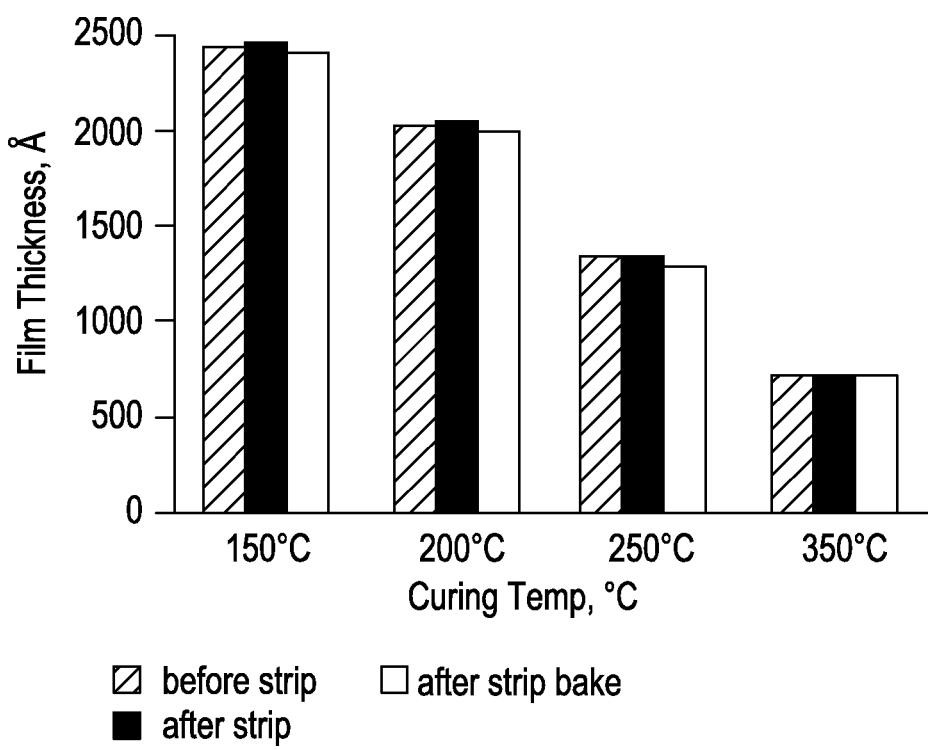

FIG. 9
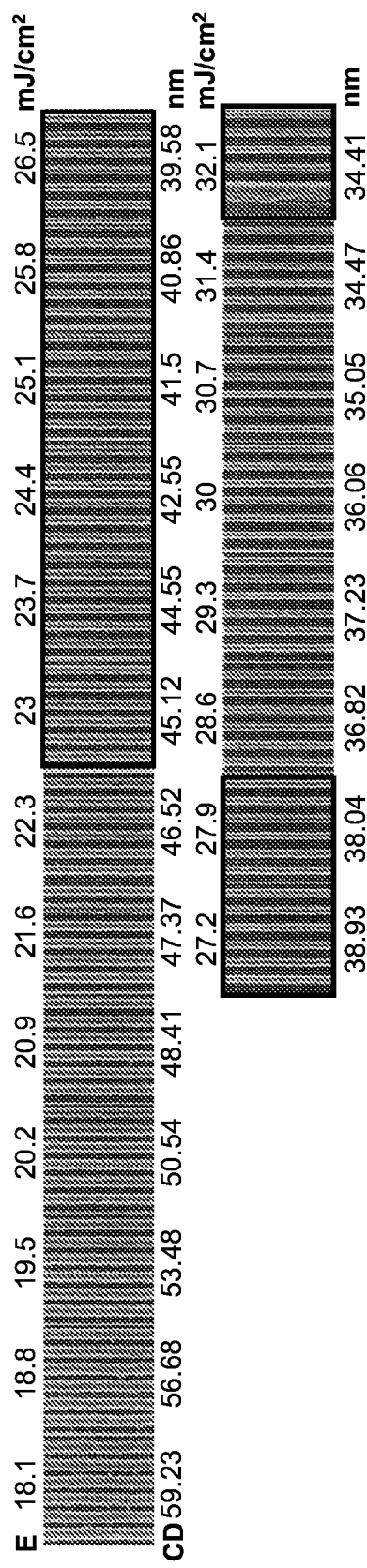
EPIC2096 on dual BARC (AR137/AR126N) Control
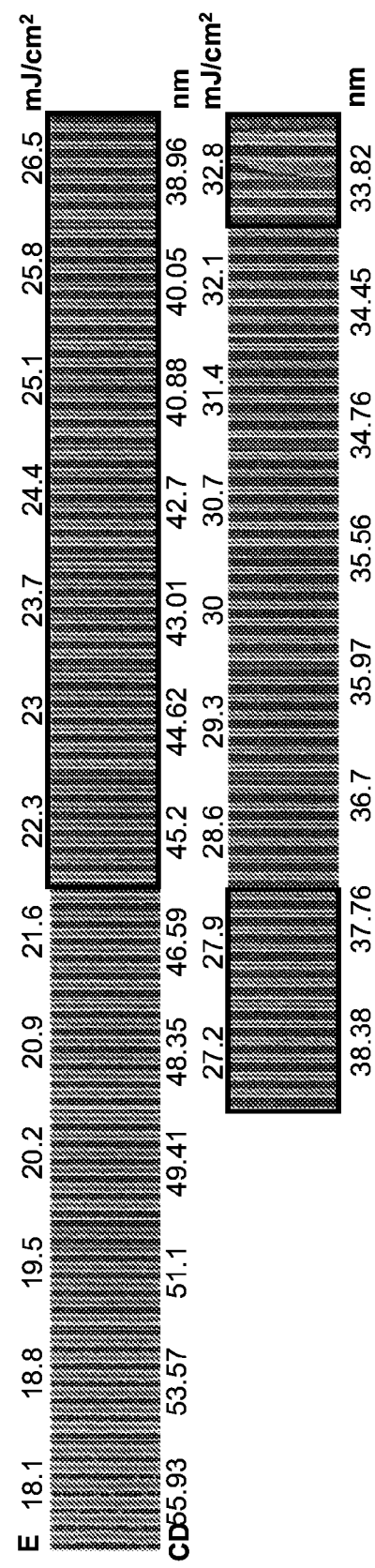
EPIC2096 on Stack with Ex. 11 (AR137/Ex. 11)

FIG. 10
Dual BARC
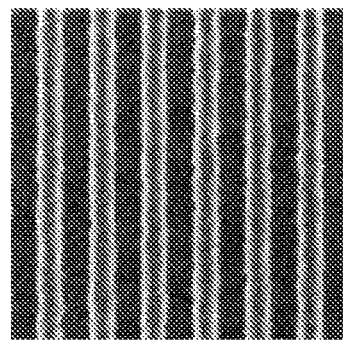
Stack with Ex. 11
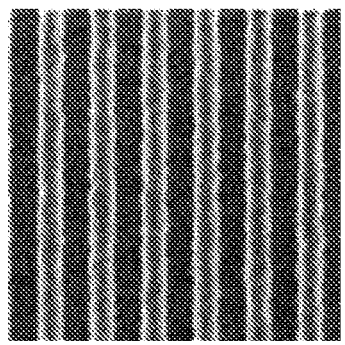
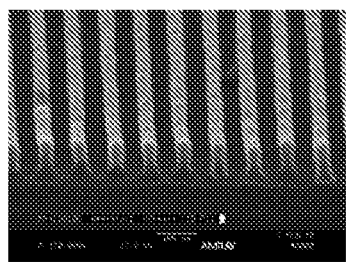
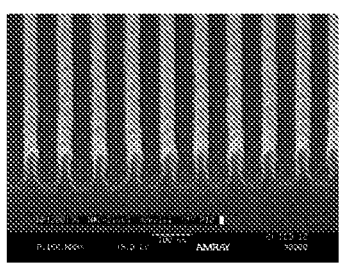
E = 25.9mJ/cm$^2$
LWR = 5.03nm
E = 24.4mJ/cm$^2$
LWR = 4.87nm

METAL HARDMASK COMPOSITIONS

REFERENCE TO RELATED APPLICATIONS

The present application claims the benefit of U.S. Provisional Application No. 61/607,035, filed Mar. 6, 2012.

BACKGROUND

With the continuous decrease in both critical dimension (CD) and pitch in "193 nm immersion lithography," the use of a hardmask in certain layers of integrated circuit (IC) fabrication has become popular, owing to the excellent etch selectivity of the hardmask materials. Among the different hardmask approaches in recent years, metal hardmasks, such as TiN hardmask, are applied, using chemical vapor deposition (CVD), onto a processed wafer. Amorphous carbon hardmask, applied through either CVD or a spin-on technique, and silicon hardmask (or silicon antireflective coating or SiARC) are among the conventional technologies in IC fabrication. A spin-on, mixed metal hardmask (SOMMH) is now gaining its attraction in the IC industry, in part due to an attempt to replace the CVD metal hardmask for cost reduction and for simplification of fabrication processes. From a fabrication point of view, SOMMH is also believed to be able to replace SiARC in an IC fabrication scheme, especially when the substrate, to which patterns are to be transferred, is a silicon oxide dielectric material.

Hybrid metal (or organometal) nano-particles have gained their popularity in recent years. These organo metal nano-particles are used in polymer matrices for achieving certain physical/chemical properties, including increased refractive index and enhanced thermal stability. In these applications, a silsesquioxane-titanate hybrid polymer system for anti-reflective coating was first discussed by Chen, as early as in 2004 (see Chen et al., *Material Chemistry and Physics*, 83 (2004), 71-77). Non-bonded titanates in silsesquioxane matrix are described in U.S. Pat. No. 5,100,503. A silsesquioxane matrix bonded to titanates with sizes less than, or equal to, 5 nm are disclosed in WO 2007/053396. However, there remains a need for new hardmask compositions that can be used to form a SOMMH film with a high cross-link density and with excellent solvent resistance. These needs and others have been met by the following invention.

SUMMARY OF INVENTION

The invention provides a composition comprising at least the following A and B:

A) a polymer comprising, in polymerized from, at least one "monomer that comprises at least one hydroxyl group;" and B) an organometal compound comprising at least one metal selected from Ti, Zr, Hf, Co, Mn, Zn, or combinations thereof, and wherein the organometal compound is present in an amount greater than 5 weight percent, based on the sum weight of A and B.

BRIEF DESCRIPTION OF THE DRAWINGS

In FIGS. 1A and 1B, for each set of bars, at each cure temperature, the individual bars from left to right are as follows: initial, post strip, and post strip bake.

In FIG. 2, for each set of bars, at each cure temperature, the individual bars from left to right are as follows: Ex. 1 and Ex. 2.

In FIG. 3, for each set of bars, at each cure temperature, the individual bars from left to right are as follows: initial, post strip, and post strip bake.

FIG. 4 depicts, for Ex. 3, at two different curing temperatures, film thickness, before PGMEA striping (90 sec single puddle), and an after post strip bake. A post coating bake at 105° C. was inserted into the process flow. In FIG. 4, for each set of bars, at each cure temperature, the individual bars from left to right are as follows: initial, and post strip bake.

FIGS. 5A-5C, at different curing temperatures, depict film thickness before and after solvent strip and after strip bake. FIG. 5A—Ex. 10, FIG. 5B—Ex. 11, and FIG. 5C—Ex. 12. In FIGS. 5A-5C, for each set of bars, at each cure temperature, the individual bars from left to right are as follows: before strip, after strip, and after strip bake.

FIG. 9 depicts "CD through dose" for original dual BARC (top) and for the stack with Ex. 11 as the bottom BARC (bottom).

FIG. 10. depicts "42 nm/84 nm" pitch lines. Left: with original dual BRAC stack. Right: the stack with Ex. 11 as the bottom B ARC.

DETAILED DESCRIPTION

Figure 1A:
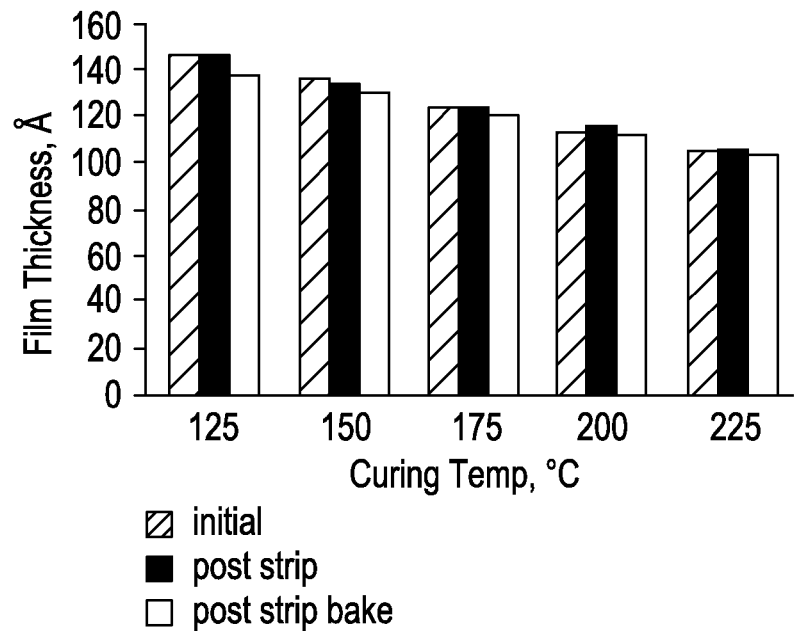
FIGS. 1A and 1B depict, at different curing temperatures, film thickness, before and after PGMEA striping (90 sec single puddle), and after a post strip bake (Ex. 1 shown in 1A, and Ex. 2 shown in 1B.

As discussed above, the invention provides a composition comprising at least the following A and B:

A) a polymer comprising, in polymerized from, at least one "monomer that comprises at least one hydroxyl group;" and B) an organometal compound comprising at least one metal selected from Ti, Zr, Hf, Co, Mn, Zn, or combinations thereof, and wherein the organometal compound is present in an amount greater than 5 weight percent, based on the sum weight of A and B.

An inventive composition may comprise a combination of two or more embodiments as described herein.

The polymer of component A may comprise a combination of two or more embodiments as described herein.

The organometal compound of component B may comprise a combination of two or more embodiments as described herein.

The "monomer that comprises at least one hydroxyl group;" may comprise a combination of two or more embodiments as described herein.

In one embodiment, the organometal compound is present in an amount greater than 10 weight percent, based on the sum weight of A and B.

In one embodiment, the organometal compound is present in an amount greater than 20 weight percent, based on the sum weight of A and B.

In one embodiment, the organometal compound is present in an amount greater than 50 weight percent, based on the sum weight of A and B.

In one embodiment, the organometal compound is present in an amount greater than 75 weight percent, based on the sum weight of A and B.

In one embodiment, the polymer of component A comprises less than 1 weight percent silicon, based on the weight of the polymer.

In one embodiment, the polymer of component A comprises less than 0.5 weight percent silicon, based on the weight of the polymer.

In one embodiment, the polymer of component A comprises less than 0.1 weight percent silicon, based on the weight of the polymer.

In one embodiment, the polymer of component A comprises less than 0.05 weight percent silicon, based on the weight of the polymer.

In one embodiment, component A is present in an amount greater than 20 weight percent, based sum weight of A and B.

In one embodiment, component A is present in an amount greater than 50 weight percent, based sum weight of A and B.

In one embodiment, component B is present in an amount less than 80 weight percent, based sum weight of A and B.

In one embodiment, the polymer of component A comprises from 5 to 100 weight percent of the "monomer that comprises at least one hydroxyl group" based on the weight of the polymer.

In one embodiment, the "monomer that comprises at least one hydroxyl group," of the polymer of component A, is selected from HEMA, OH-styrene, or combinations thereof.

In one embodiment, the "monomer that comprises at least one hydroxyl group," of the polymer of component A, is selected from a hydroxy acrylate monomer or a hydroxy alkyl acrylate monomer.

In one embodiment, the "monomer that comprises at least one hydroxyl group," of the polymer of component A, is selected from OH-acrylate, OH-methacrylate, or OH-ethacrylate.

In one embodiment, the polymer of component A further comprises an acrylate monomer or an alkyl acrylate monomer.

In one embodiment, the polymer of component A further comprises an acrylate, a methacrylate, or an ethacrylate.

In one embodiment, the polymer of component A has a molecular weight distribution less than, or equal to, 4.0, or less than, or equal to, 3.5, or less than, or equal to, 3.0.

In one embodiment, the polymer of component A has a molecular weight distribution greater than, or equal to, 1.1, or greater than, or equal to, 1.5, or greater than, or equal to, 1.7.

In one embodiment, the polymer of component A has a number average molecular weight (Mn) less than, or equal to 15000 g/mole, or less than, or equal to, 12000 g/mole, or less than, or equal to, 10000 g/mole.

In one embodiment, the polymer of component A has a number average molecular weight (Mn) greater than, or equal to, 4000 g/mole, or greater than, or equal to, 5000 g/mole, or greater than, or equal to, 6000 g/mole.

In one embodiment, the polymer of component A has a weight average molecular weight (Mw) less than, or equal to 35000 g/mole, or less than, or equal to, 30000 g/mole, or less than, or equal to, 25000 g/mole.

In one embodiment, the polymer of component A has a weight average molecular weight (Mw) greater than, or equal to, 7000 g/mole, or greater than, or equal to, 7500 g/mole, or greater than, or equal to, 8000 g/mole.

In one embodiment, the organometal compound is chelated with at least two oxygen atoms.

In one embodiment, organometal compound comprises a metal selected from Ti, Zr, Hf, Co, Mn or Zn.

In one embodiment, organometal compound comprises a metal selected from Ti, Zr, or combinations thereof.

In one embodiment, the organometal compound comprises a metal selected from Ti or Zr.

In one embodiment, the organometal compound is selected from the following compounds:

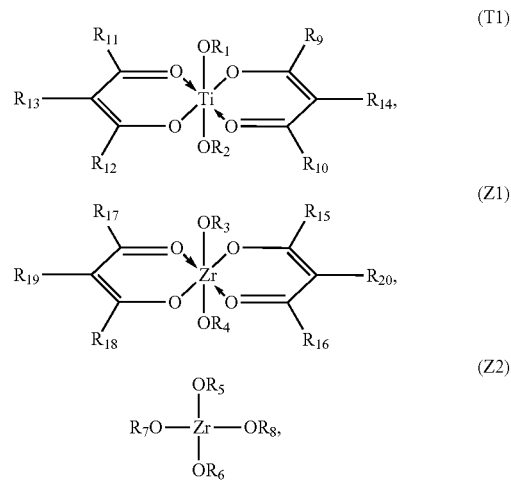

or combinations thereof, and wherein R1, R2, R3, R4, R5, R6, R7 and R8 are each independently selected from the following:
  i) hydrocarbon group,
  ii) a substituted hydrocarbon group,
  iii) a hydrocarbon group containing at least one heteroatom in its backbone, or
  iv) a substituted hydrocarbon group containing at least one heteroatom in its backbone; and wherein R9, R10, R11, R12, R13, R14, R15, R16, R17, R18, R19 and R20 are each independently selected from the following:
  i) a hydrogen atom,
  ii) a hydrocarbon group,
  iii) a substituted hydrocarbon group,
  iv) a hydrocarbon group containing at least one heteroatom in its backbone, or
  v) a substituted hydrocarbon group containing at least one heteroatom in its backbone.

In one embodiment, for compounds T1, Z1 and Z2, the R1, R2, R3, R4, R5, R6, R7 and R8 are each independently selected from the following:
  i) hydrocarbon group, or
  ii) a substituted hydrocarbon group; and wherein R9, R10, R11, R12, R13, R14, R15, R16, R17, R18, R19 and R20 are each independently selected from the following:
  i) a hydrogen atom,
  ii) a hydrocarbon group.

In one embodiment, for compounds T1, Z1 and Z2, the R1, R2, R3, R4, R5, R6, R7 and R8 are each independently selected from the following:
  i) hydrocarbon group; and wherein R9, R10, R11, R12, R13, R14, R15, R16, R17, R18, R19 and R20 are each independently selected from the following:
  i) a hydrogen atom,
  ii) a hydrocarbon group.

In one embodiment, for compounds T1, Z1 and Z2, the R1, R2, R3, R4, R5, R6, R7 and R8 are each independently selected from the following:

i) hydrocarbon group; and wherein R9, R10, R11, R12, R13, R14, R15, R16, R17, R18, R19 and R20 are each independently selected from the following:

ii) a hydrocarbon group.

In one embodiment, the organometal compound is selected from the following compounds:

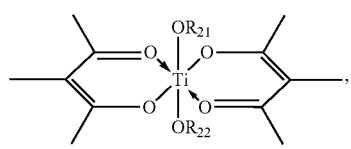
(T2)

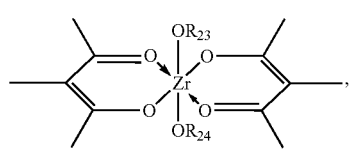
(Z3)

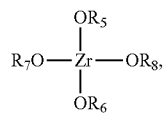
(Z2)

or combinations thereof; and wherein R5, R6, R7, R8, R21, R22, R23 and R24 are each independently selected from the following:

i) a hydrocarbon group, ii) a substituted hydrocarbon group, iii) a hydrocarbon group containing at least one heteroatom in its backbone, or iv) a substituted hydrocarbon group containing at least one heteroatom in its backbone. In a further embodiment, R5, R6, R7, R8, R21, R22, R23 and R24 are each independently selected from the following: i) a hydrocarbon group, or ii) a substituted hydrocarbon group. In a further embodiment, R5, R6, R7, R8, R21, R22, R23 and R24 are each independently selected from the following: i) a hydrocarbon group.

In one embodiment, the organometal compound is selected from the following compounds:

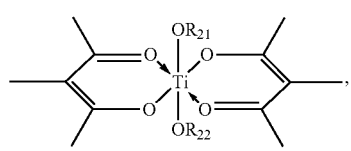
(T2)

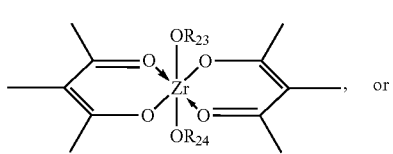
(Z3)

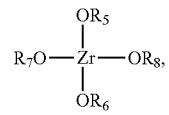
(Z2)

wherein R5, R6, R7, R8, R21, R22, R23 and R24 are each independently selected from the following:

i) a hydrocarbon group, ii) a substituted hydrocarbon group, iii) a hydrocarbon group containing at least one heteroatom in its backbone, or iv) a substituted hydrocarbon group containing at least one heteroatom in its backbone. In a further embodiment, R5, R6, R7, R8, R21, R22, R23 and R24 are each independently selected from the following: i) a hydrocarbon group, or ii) a substituted hydrocarbon group. In a further embodiment, R5, R6, R7, R8, R21, R22, R23 and R24 are each independently selected from the following: i) a hydrocarbon group.

In one embodiment, the organometal compound is selected from the following compounds:

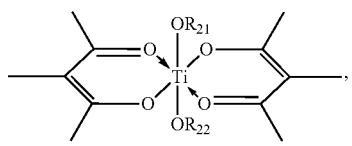
(T2)

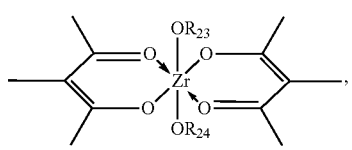
(Z3)

or combinations thereof;

wherein R21, R22, R23 and R24 are each independently selected from the following:

i) a hydrocarbon group, ii) a substituted hydrocarbon group, iii) a hydrocarbon group containing at least one heteroatom in its backbone, or iv) a substituted hydrocarbon group containing at least one heteroatom in its backbone. In a further embodiment, R21, R22, R23 and R24 are each independently selected from the following: i) a hydrocarbon group, or ii) a substituted hydrocarbon group. In a further embodiment, R21, R22, R23 and R24 are each independently selected from the following: i) a hydrocarbon group.

In one embodiment, the organometal compound is selected from the following compounds:

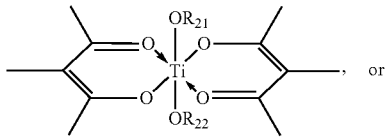
(T2)
, or

-continued

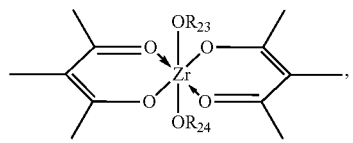
(T3)

wherein R21, R22, R23 and R24 are each independently selected from the following:
i) a hydrocarbon group,
ii) a substituted hydrocarbon group,
iii) a hydrocarbon group containing at least one heteroatom in its backbone, or
iv) a substituted hydrocarbon group containing at least one heteroatom in its backbone. In a further embodiment, R21, R22, R23 and R24 are each independently selected from the following: i) a hydrocarbon group, or ii) a substituted hydrocarbon group. In a further embodiment, R21, R22, R23 and R24 are each independently selected from the following: i) a hydrocarbon group.

In one embodiment, the organometal compound is selected from the following compounds:

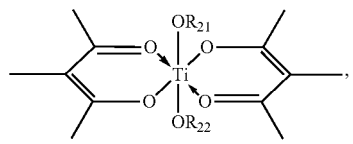
(T2)

wherein R21 and R22 are each independently selected from the following:
i) a hydrocarbon group,
ii) a substituted hydrocarbon group,
iii) a hydrocarbon group containing at least one heteroatom in its backbone, or
iv) a substituted hydrocarbon group containing at least one heteroatom in its backbone. In a further embodiment, R21 and R22 are each independently selected from the following: i) a hydrocarbon group, or ii) a substituted hydrocarbon group. In a further embodiment, R21 and R22 are each independently selected from the following: i) a hydrocarbon group.

In one embodiment, the organometal compound is selected from the following compounds:

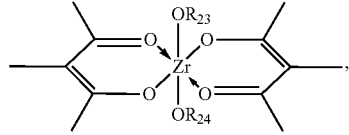
(Z3)

wherein R23 and R24 are each independently selected from the following:
i) a hydrocarbon group,
ii) a substituted hydrocarbon group,
iii) a hydrocarbon group containing at least one heteroatom in its backbone, or
iv) a substituted hydrocarbon group containing at least one heteroatom in its backbone. In a further embodiment, R23 and R24 are each independently selected from the following:

i) a hydrocarbon group, or ii) a substituted hydrocarbon group. In a further embodiment, R23 and R24 are each independently selected from the following: i) a hydrocarbon group.

In one embodiment, the organometal compound is selected from the following compounds:

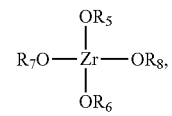
(Z2)

wherein R5, R6, R7 and R8 are each independently selected from the following:
i) a hydrocarbon group,
ii) a substituted hydrocarbon group,
iii) a hydrocarbon group containing at least one heteroatom in its backbone, or
iv) a substituted hydrocarbon group containing at least one heteroatom in its backbone. In a further embodiment, R5, R6, R7 and R8 are each independently selected from the following: i) a hydrocarbon group, or ii) a substituted hydrocarbon group. In a further embodiment, R5, R6, R7 and R8 are each independently selected from the following: i) a hydrocarbon group.

In one embodiment, the organometal compound is selected from the following compounds: T2, Z2, or combinations thereof; and
wherein R21, R22, R5, R6, R7 and R8 are each independently selected from the following:
i) a hydrocarbon group,
ii) a substituted hydrocarbon group,
iii) a hydrocarbon group containing at least one heteroatom in its backbone, or
iv) a substituted hydrocarbon group containing at least one heteroatom in its backbone. In a further embodiment, R21, R22, R5, R6, R7 and R8 are each independently selected from the following: i) a hydrocarbon group, or ii) a substituted hydrocarbon group. In a further embodiment, R21, R22, R5, R6, R7 and R8 are each independently selected from the following: i) a hydrocarbon group.

In one embodiment, the organometal compound is selected from the following compounds: T2, or Z2; and
wherein R21, R22, R5, R6, R7 and R8 are each independently selected from the following:
i) a hydrocarbon group,
ii) a substituted hydrocarbon group,
iii) a hydrocarbon group containing at least one heteroatom in its backbone, or
iv) a substituted hydrocarbon group containing at least one heteroatom in its backbone. In a further embodiment, R21, R22, R5, R6, R7 and R8 are each independently selected from the following: i) a hydrocarbon group, or ii) a substituted hydrocarbon group. In a further embodiment, R21, R22, R5, R6, R7 and R8 are each independently selected from the following: i) a hydrocarbon group.

In one embodiment, the organometal compound is selected from the following compounds: Z3, Z2, or combinations thereof; and
wherein R23, R24, R5, R6, R7 and R8 are each independently selected from the following:
i) a hydrocarbon group,
ii) a substituted hydrocarbon group, iii) a hydrocarbon group containing at least one heteroatom in its backbone, or iv) a substituted hydrocarbon group containing at least one heteroatom in its backbone. In a further embodiment, R23, R24, R5, R6, R7 and R8 are each independently selected from the following: i) a hydrocarbon group, or ii) a substituted hydrocarbon group. In a further embodiment, R22, R24, R5, R6, R7 and R8 are each independently selected from the following: i) a hydrocarbon group.

In one embodiment, the organometal compound is selected from the following compounds: Z3, or Z2; and wherein R23, R24, R5, R6, R7 and R8 are each independently selected from the following:

i) a hydrocarbon group, ii) a substituted hydrocarbon group, iii) a hydrocarbon group containing at least one heteroatom in its backbone, or iv) a substituted hydrocarbon group containing at least one heteroatom in its backbone. In a further embodiment, R23, R24, R5, R6, R7 and R8 are each independently selected from the following: i) a hydrocarbon group, or ii) a substituted hydrocarbon group. In a further embodiment, R23, R24, R5, R6, R7 and R8 are each independently selected from the following: i) a hydrocarbon group.

In one embodiment, the composition has a refractive index greater than, or equal to, 1.60, at 673 nm wavelength, after the composition is thermally annealed at 350° C. for 60 seconds. The refractive index can be measured with a THERMA-WAVE Spectroscopic Ellipsometer (Model 7341), at 673 nm wavelength, by assuming k=0 (zero absorbance at 673 nm wavelength).

An inventive composition may comprise a combination of two or more embodiments as described herein.

The invention also provides a chelated metal compound formed from an inventive composition, and comprising at least one ligand derived from the polymer of component A.

The invention also provides an article comprising at least one component formed from an inventive composition.

In one embodiment, the article is an electronic device.

In one embodiment, the article is an LED encapsulant.

In one embodiment, the article is an optical fiber cladding.

In one embodiment, the article is a metal hardmask.

The invention also provides a film comprising at least one layer formed from an inventive composition. In a further embodiment, the film is a metal hardmask.

In one embodiment, the film comprises at least two layers. In a further embodiment, one layer is formed from an inventive composition, and the other layer is formed from another composition comprising at least one polymer.

The invention also provides a film comprising at least two layers, and wherein at least one layer is an anti-reflective layer formed from an inventive composition. In a further embodiment, the other layer is a photoresist layer.

An inventive article may comprise a combination of two or more embodiments as described herein.

An inventive film may comprise a combination of two or more embodiments as described herein.

The invention also provides a method of forming a coated substrate, said method comprising at least the following:

a) applying an inventive composition over at least a portion of the substrate, and b) thermally treating (for example, applying heat) the composition to form the coating.

In one embodiment, the coating is a hardmask layer.

The invention also provides a method of forming a coating on a substrate, said method comprising at least the following:

applying an inventive composition over at least a portion of the substrate, or over one or more intermediate layers applied over said substrate, and thermally treating (for example, applying heat) the inventive composition to form the coating. In a further embodiment, multiple layers of the inventive composition are applied over at least a portion of the substrate, or over one or more intermediate layers applied over said substrate.

In one embodiment, the coating is a hardmask layer.

An inventive method may comprise a combination of two or more embodiments as described herein.

When used in an IC fabrication, a SOMMH is preferred to function as a bottom antireflective coating (BARC), either being used alone, or along with another BARC, to form a BARC stack. In either situation, a SOMMH should yield a desirable lithography performance to meet lithography specifications, as characterized by, for example, energy latitude (EL), depth of focus (DOE), line width roughness (LWR), line edge roughness (LER), pattern collapse margin (PCM), in addition to a good feature profile.

Although organometal compound can aggregate by forming —O-M-O-M-O— bonds at a high curing temperature, molecular organometals, in general, do not form a uniform film in a spin coating process. Moreover, vaporization (or sublimation) of an organometal in a coated film during curing bake could post a serious concern. However, it has been discover that the invention compositions are excellent binder materials in SOMMH formulations. It was also discovered that the inventive compositions have excellent thermal stability, for example, in terms of film thickness shrinkage.

It has also been discovered that the inventive compositions, when thermally treated at high temperatures (for example, 350° C.) form cured films that can be effectively removed with commercially available cleaning solutions, such as SC-1 and Piranha.

The inventive compositions can be used in multi-layered coatings, for example, tri-layer resists, which typically comprise the following: (a) a curable underlayer composition on a substrate; (b) a hardmask composition (for example, a hardmask layer formed from an inventive composition described herein) applied above the curable composition; and (c) a photoresist composition layer applied above the hard mask composition. Coating compositions and lithographic processes are described in U.S. Publication 2007/0238052 and U.S. Publication 2009/0148789, each incorporated herein by reference.

The inventive compositions can be used to replace the following: CVD SiON, CVD low-temperature TEOS or oxide for quad layer application, and/or CVD HM in litho-etch-litho-etch double patterning.

DEFINITIONS

The term "composition," as used herein, includes a mixture of materials which comprise the composition, as well as reaction products and decomposition products formed from the materials of the composition.

The term "polymer," as used herein, refers to a polymeric compound prepared by polymerizing monomers, whether of the same or a different type. The generic term polymer thus embraces the term homopolymer (employed to refer to polymers prepared from only one type of monomer, with the understanding that trace amounts of impurities can be incorporated into the polymer structure), and the term interpolymer as defined hereinafter.

The term "interpolymer," as used herein, refers to polymers prepared by the polymerization of at least two different types of monomers. The generic term interpolymer includes copolymers (employed to refer to polymers prepared from two different monomers), and polymers prepared from more than two different types of monomers.

The term "substituted hydrocarbon," as used herein refers to a hydrocarbon with one or more of the hydrogens substituted with another group, such as, for example, a halogen (such as chlorine or bromine), or other group of atoms, such as, for example, —OH, —CN, —SH, —SO3H.

The terms "comprising," "including," "having," and their derivatives, are not intended to exclude the presence of any additional component, step or procedure, whether or not the same is specifically disclosed. In order to avoid any doubt, all compositions claimed through use of the term "comprising" may include any additional additive, adjuvant, or compound, whether polymeric or otherwise, unless stated to the contrary. In contrast, the term, "consisting essentially of" excludes from the scope of any succeeding recitation any other component, step, or procedure, excepting those that are not essential to operability. The term "consisting of" excludes any component, step, or procedure not specifically delineated or listed.

TEST METHODS

Measurement of Molecular Weight by GPC

Molecular weight of the prepolymer was monitored by Gel Permeation Chromatography (GPC), also referred to as Size Exclusion Chromatography (SEC). The instrument was equipped with a set of columns appropriate for measuring molecular weights in the range of about 500 g/mole to at least about 100,000 g/mole, based on polystyrene calibration standards. Four columns installed series, "SHODEX LF-805, 804, 803 and 802 GPC columns," 8 mm diameter×300 mm length, available from Thomson Instrument Co., were used in each analysis. All four columns were maintained at 30° C. The mobile phase was tetrahydrofuran (THF), and it was pumped at a rate of 1 mL/min Injection volume was 100 microliter. The instrument was also equipped with a refractive index detector. Calibration was done using polystyrene standards with narrow MWDs, available from Polymer Standards Service GmbH, Mainz, Germany. The Mn, Mw, and MWD were calculated using ENPOWER GPC software available from WATERS.

EXPERIMENTAL

I. Reagents

A. Binder Polymers (Component A)

Please note the following abbreviations:

HEMA=2-Hydroxyethyl methacrylate,

MMA=Methyl methacrylate, tBA=tert-Butylacrylate, and

IPGMA=(2,2-Dimethyl-1,3-dioxolan-4-yl)methyl methacrylate.

The chemical structures of these monomers are shown below. From left to right: HEMA, MMA, tBA, and IPGMA.

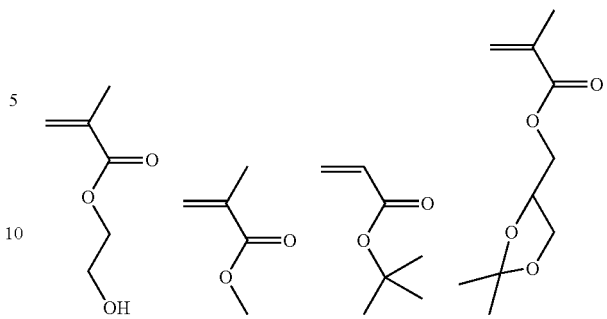

1) Poly(2-hydroxyethyl methacrylate) (soluble in HBM)
2) 30/70(w) HEMA/MMA (soluble in PGMEA or HBM)
3) 30/70(w) HEMA/tBA (soluble in all four solvents, HMB, PGMEA, MIBC, and 2-methyl-1-butanol)
4) 30/70(w) HEMA/IPGMA (soluble in all four solvents, HMB, PGMEA, MIBC, and 2-methyl-1-butanol)

B. Organometal Compounds (Component B)
1) TYZOR AA-105 available from DORF KETAL.

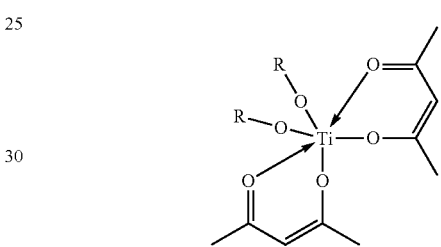

2) AA-105-IPG—see below.

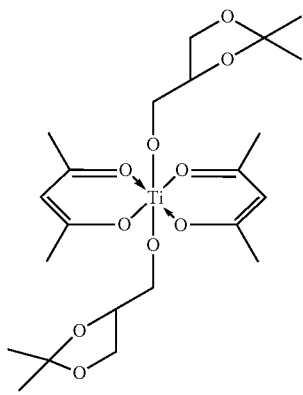

3) Zirconium butoxide available from ALF AESAR (a Johnson Matthey Company).

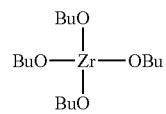

C. Solvents
1) Propylene glycol methylether acetate (PGMEA, by 146° C.)
2) Methyl-2,3-hydroxyisobutyrate (HBM, by 137° C.)

3) 4-Methyl-2-pentanol (MIBC, by 132° C.)

4) 2-Methyl-1-butanol (bp 129° C.)

D. Thermal Acid Generator

Triethylammonium 4-Methylbenzenesulfonate (TEA pTS)—see below.

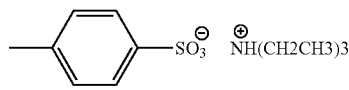

II. Syntheses of Binder Polymers (Component A)

A) 30/70(w) HEMA/MMA

Preparation of a "60 g (polymer) batch" of "30/70(w) HEMA/MMA."

Monomer/Initiator Feeding Solution

To a suitable container (a glass bottle), the following materials were added: 18.0 g HEMA, 42.0 g MMA and 30.0 g PGMEA (propylene glycol methylether acetate) solvent. The container was capped, and gently shaken to mix all components. The container was then placed in an ice bath, to equilibrate the temperature of the container with the bath temperature. An initiator (1.8 g of V-601 initiator) was then added to the container. The container was removed from the ice bath, and shaken to completely dissolve the initiator, and then placed back into the ice bath. The initiator, V-601, is dimethyl-2,2'-azobis(2-methylpropionate) available from Wako Pure Chemical Industries, Ltd.

Polymerization

The reactor was a 250 ml, 3-neck, round bottom flask, equipped with a condenser and a thermal couple, and connected to a feeding line for the monomer/initiator solution (prepared above). The thermal couple was used, in conjunction with a controlled heating mantle, to monitor and control the solution temperature in the reactor. The contents of the reactor were stirred with a magnetic stir bar.

The reactor was charge with "30.0 g PGMEA," and the reactor temperature was increased and equilibrated at 99° C. (±2° C.) with adequate agitation. The monomer/initiator solution (prepared above) was fed into the reactor at 99° C., at feeding rate of 250 µl/13 sec, using a HAMILTON dual syringe pump. The total feeding time was approximately 90 minutes. After completion of this feed, the reactor temperature was held at 99° C. for an additional two hours, and then the reaction flask was remove from the heating mantle, and allowed to cool naturally to room temperature. Approximately "90 g of PGMEA" was added to the reactor polymer to obtain a uniform solution after stirring. The polymer solution in the reactor was used "as is," without further purification. The percent solid content of the polymer in the solution was determined using a "weight loss method." In this method, approximately "0.1 g of the polymer solution" was weighted into an aluminum pan, and approximately "0.6 g acetone" was added to dilute the solution and to promote an even coating at the bottom of the pan. The pan (plus contents) was placed in a thermal oven, equilibrated at approximately 110° C., and the pan (plus contents) was thermally treated for 15 minutes. The final polymer solution contained approximately 28 wt % polymer, based on the weight of the polymer solution.

B) 30/70(w) HEMA/tBA in PGMEA

A "30/70(w) HEMA/tBA" polymer was prepared using a similar method as discussed above for was used for "30/70(w) HEMA/MMA," except "42.0 g of MMA" was replaced with "42.0 g tBA" in the monomer/initiator solution. A "60 g batch of the polymer" was prepared with approximately 49 wt % polymer in solution, as determined using the "weight loss method".

C) 30/70(w) HEMA/tBA in MIBC

A "30/70(w) HEMA/tBA" polymer was prepared using a similar method as discussed above for B), except for the following changes:

i) MIBC was used as a solvent to replace PGMEA, and ii) the reactor was charged with "60 g of MIBC" instead of "30 g PGMEA."

A polymer solution with approximately 40 wt % polymer was obtained, as determined using the "weight loss method".

D) 30/70(w) HEMA/IPGMA

A synthesis method, similar to the one for "30/70(w) HEMA/MMA," was used, except for the following differences.

i) The reactor temperature was maintained at 70° C. during the addition of the monomer solution, and was maintained at 70° C. for an additional two hours after completion of the addition of the monomer solution.

ii) The initiator (4.2 g of v-601 initiator) was added to the reactor (at 70° C.), at once, as an approximately "30 wt % solution in PGMEA," and the temperature of the reactor was allowed to come back to 70° C., before the addition of the monomer solution into the reactor.

iii) An ice batch was not used in this polymerization. The monomer solution was maintained at room temperature during its addition to the reaction flask.

A "60 g batch of the polymer" was prepared. A polymer solution with approximately 50 wt % polymer was obtained, as determined using the "weight loss method".

E) Poly(2-hydroxyethyl methacrylate)

Preparation of a "30 g batch of the polymer" of poly(2-hydroxyethyl methacrylate).

Monomer/Initiator Feeding Solution

To a suitable container (a glass bottle), the following materials were added: 30.0 g HEMA and 15.0 g HBM solvent. The container was capped, and gently shaken to mix all components. The container was then placed in an ice bath, to equilibrate the temperature of the container with the bath temperature. An initiator (0.9 g of V-601 initiator) was then added to the container. The container was removed from the ice bath, and shaken to completely dissolve the initiator, and then placed back into the ice bath.

Polymerization

The reactor was a 250 ml, 3-neck, round bottom flask, equipped with a condenser and a thermal couple, and connected to a feeding line for the monomer/initiator solution (prepared above). The thermal couple was used, in conjunction with a controlled heating mantle, to monitor and control the solution temperature in the reactor. The contents of the reactor were stirred with a magnetic stir bar.

The reactor was charge with "15.0 g HBM," and the reactor temperature was increased and equilibrated at 99° C. (±2° C.) with adequate agitation. The monomer/initiator solution (prepared above) was fed into the reactor, at 99° C., at feeding rate of 250 µl/26 sec, using a HAMILTON dual syringe pump. The total feeding time was approximately 90 minutes. After completion of this feed, the reactor temperature was held at 99° C. for an additional two hours, and then the reaction flask was remove from the heating mantle, and allowed to cool naturally to room temperature. Approximately "140 g of PGMEA" was added to the reactor polymer to obtain a uniform solution after stirring. The polymer solution in the reactor was used "as is," without further purification. The percent solid content of the polymer in the solution was determined using the "weight loss method," as discussed above. The final polymer solution contained approximately 15 wt % polymer, based on the weight of the polymer solution.

Molecular weight and molecular weight distribution of these polymers (except HEMA homopolymer) were determined using the aforementioned GPC method, and are summarized in Table 1 below.

TABLE 1

Molecular Weights and Molecular Weight Distributions

| Binder Polymers | Mw | Mn | PDI |
|---|---|---|---|
| 30/70 (w) HEMA/MMA | 16526 | 8335 | 1.98 |
| 30/70 (w) HEMA/tBA in PGMEA | 16233 | 6624 | 2.45 |
| 30/70 (w) HEMA/tBA in MIBC | 8283 | 4167 | 1.99 |
| 30/70 (w) HEMA/IPGMA | 21115 | 7234 | 2.92 |

III. Preparation of Metal Hardmask Formulations

Each polymer solution was used "as is" from the polymerization, or further diluted with additional solvent used as the polymerization solvent.

30/70 HEMA/MMA polymer solution: 10.0 wt % polymer in PGMEA
30/70 HEMA/tBA polymer solution: 10.0 wt % polymer in PGMEA
30/70 HEMA/tBA polymer solution: 39.8 wt % polymer in MIBC
30/70 HEMA/IPGMA polymer solution: 10.0 wt % polymer in PGMEA.
Poly(HEMA) polymer solution: 14.7 wt % polymer in methyl-2-hydroxy isobutyrate (HBM).
TYZOR AA-105 organometal solution: 10.0 wt % organometal in PGMEA.
TYZOR AA-105 organometal solution: 20.0 wt % organometal in PGMEA.
TYZOR AA-105 organometal solution: 10.0 wt % organometal in HBM.
TYZOR AA-105 organometal solution: 25.0 wt % organometal in 2-methyl-1-butanol.
Zirconium butoxide organometal solution: 25.0 wt % organometal in PGMEA and 1-Butanol
AA-105-IPG organometal solution: 10.0 wt % organometal in PGMEA.
TAG Solution=TEA pTS stock solution: 5.0 wt % thermal acid generator in HBM.

The hardmask formulations were prepared under ambient conditions. Each formulation was prepared by mixing the corresponding stock solutions and solvent(s) in a suitable container (glass vial) with the following addition order: 1) polymer solution, 2) solvent, 3) organometal solution, and optionally 4) TAG solution. The following (Tables 2-1 to 2-7) provide a summary of the formulations.

TABLE 2-1

Metal Hardmask Formulations Based on 30/70 (w) HEMA/MMA binder polymer and TYZOR AA-105

| Examples | 30/70 (w) HEMA/MMA 10.0 wt % in PGMEA | TYZOR AA-105 10.0 wt % in PGMEA | PGMEA Solvent |
|---|---|---|---|
| Ex. 1 | 2.0 g | 2.0 g | 16.0 g |
| Ex. 2 | 1.0 g | 3.0 g | 16.0 g |
| Ex. 3 | 1.5 g | 4.5 g | 4.0 g |

TABLE 2-2

Metal Hardmask Formulations Based on 30/70 (w) HEMA/tBA Binder Polymer and TYZOR AA-105

| Examples | 30/70 (w) HEMA/tBA 10.0 wt % in PGMEA | TYZOR AA-105 10.0 wt % in PGMEA | TAG TEA pTS 5 wt % in HBM | PGMEA Solvent |
|---|---|---|---|---|
| Ex. 4 | 2.25 g | 6.75 g | 0 | 6.0 g |
| Ex. 5 | 2.25 g | 6.75 g | 1.44 g | 4.56 g |

TABLE 2-3

Metal Hardmask Formulation Based on Poly(HEMA) Binder Polymer and TYZOR AA-105

| Examples | Poly(HEMA) 14.7 wt % in HBM | TYZOR AA-105 10.0 wt % in HBM | HBM Solvent |
|---|---|---|---|
| Ex. 6 | 1.531 g | 6.750 g | 6.720 g |

TABLE 2-4

Metal Hardmask Formulation Based on 30/70 (w) HEMA/IPGMA Binder Polymer and TYZOR AA-105

| Examples | 30/70 HEMA/IPGMA 10.0 wt % in PGMEA | TYZOR AA-105 10.0 wt % in PGMEA | AA-105-IPG 10.0 wt % in PGMEA | TAG TEA pTS 5 wt % in HBM | PGMEA solvent |
|---|---|---|---|---|---|
| Ex. 7 | 2.250 g | 0 | 6.750 g | 1.440 g | 4.56 g |
| Ex. 8 | 2.250 g | 6.750 g | 0 | 1.440 g | 4.56 g |

TABLE 2-5

Metal Hardmask Formulation Based on 30/70 HEMA/MMA Binder Polymer and Zirconium Butoxide Organometal

| Examples | 30/70 HEMA/MMA 10.0 wt % in PGMEA | Zirconium butoxide 25.0 wt % in PGMEA/1-butanol | HBM solvent |
|---|---|---|---|
| Ex. 9 | 2.250 g | 2.700 g | 10.05 g |

TABLE 2-6

Metal Hardmask Formulation Based on 30/70 (w) HEMA/tBA Binder Polymer and TYZOR AA-105, using Alcohol as a Major Solvent

| Examples | 30/70 (w) HEMA/tBA 39.8 wt % in MIBC | TYZOR AA-105 25.0 wt % in 2-methyl-1-butanol | TAG TEA pTS 5 wt % in HBM | 2-methyl-1-butanol Solvent |
|---|---|---|---|---|
| Ex. 10 | 3.5176 g | 16.800 g | 0 | 19.68 g |
| Ex. 11 | 3.342 g | 15.960 g | 1.366 g | 19.33 g |
| Ex. 12 | 3.241 g | 15.480 g | 2.120 g | 15.16 g |

TABLE 2-7

Metal Hardmask Formulations Based on 30/70 (w) HEMA/MMA Binder Polymer and TYZOR AA-105

| Examples | 30/70 (w) HEMA/MMA 10.0 wt % in PGMEA | TYZOR AA-105 20.0 wt % in PGMEA | PGMEA Solvent |
|---|---|---|---|
| Ex. 13 | 5.813 g | 0 | 4.919 g |
| Ex. 14 | 4.065 g | 0.6667 g | 5.268 g |
| Ex. 15 | 3.557 g | 1.750 g | 4.693 g |
| Ex. 16 | 3.049 g | 4.500 g | 2.451 g |
| Ex. 17 | 2.541 g | 7.083 g | 0.376 g |

IV. Overview—Preparation of the Spin Coat—Hardmask

For Solvent Stripping Test, Etch Test, and Thermal Stability Test: wafer—bare silicon wafers from WaferNet Inc., diameter of 8 inch; thickness of 0.7 mm. No pre-treatment.

For lithography study: wafer—bare silicon wafers from WaferNet Inc., diameter of 12 inch; thickness of 0.7 mm. No pre-treatment Each hardmask formulation was filtered through a "0.2 μm pore size" TFPE syringe filter, before each test.

The spin coating for the Solvent Stripping Test, the Etch Test, and the Thermal Stability Test was performed using TEL, ACT 2 Track with manual dispensing (using 1.5 to 2.5 ml of a formulation for each coating).

1) Solvent Stripping Test—each hardmask formulation was spin coated onto a wafer at 1500 RPM, followed by an optional post coating bake at 105° C. for 60 seconds, and then by a curing bake at a desired temperature for 60 seconds. The coated wafer was then brought to a coating bowl, where a solvent was slowly dispensed on the wafer to form a puddle. The puddle was held for 90 seconds, before spinning off the solvent. The film thickness of the metal hardmask was measured before and after the "solvent stripping test," using a THERMA-WAVE Spectroscopic Ellipsometer Model 7341. The change in film thickness, before and after the stripping, indicates the solvent resistance of a metal hardmask.

2) Etch Test—each hardmask formulation was spin coated onto a wafer at 1500 RPM, as discussed above, and then cured at 250° C. for 60 seconds. After the metal hardmask film was cured, the cured film was etched using a PLASMA-THERM 790 RIE system, using a specified power (90 W for $O_2$ etch and 50 W for $CF_4$ etch) and etch time. The film thickness, before and after etch, was measured. The etch rate for each metal hardmask film was calculated using the "total film thickness loss" and the etch time.

3) Thermal Stability Test—each hardmask formulation was spin coated onto a wafer at 1500 RPM, followed by an optional post coating bake at 105° C. for 60 seconds, and then by a curing bake at a desired temperature for 60 seconds. Next, the cured metal hardmask was heated at 250° C., for 600 seconds (10 minutes), and the film thickness change during this heating process was measured, and used to indicate the thermal stability of the film. For typical electronic applications, a metal hardmask film should not to lose more than 5% of its film thickness.

4) Lithography Test was used to test the bottom antireflective coating (BARC) property of the metal hardmask. See Table 26 below for the process conditions. In this test, a metal hardmask was tested in a dual BARC stack, by replacing the bottom BARC in the stack with an inventive metal hardmask. The lithography performance of the stack containing the inventive metal hardmask was compared to the original dual BARC stack.

V. Solvent Strip Test—Overview

See the overview for the "solvent strip test" discussed above. Optionally, after solvent stripping, the wafer was brought back to a hot plate, and baked at 105° C. for 60 second (post strip back). The film thickness was then measured again. This optional baking was to remove absorbed solvent in the film.

Study a: Organometal as a Cross-Linker (Strip Test)

To test the cross-linking function of an organometal, the resistance to solvent stripping for films, cured at different curing temperatures, was determined using film thickness loss during a "90 sec single puddle" PGMEA striping. A detailed test flow is outlined in Table 3 below (FT=Film Thickness).

TABLE 3

A Process Flow for a Solvent Strip Test

| | |
|---|---|
| Spin coating | 1500 rpm |
| curing bake | 125, 150, 175, 200, 225° C., 60 sec |
| FT measurement | noted as "initial" |
| PGMEA strip | 90 sec single puddle |
| FT measurement | noted as "post strip" |
| post strip bake | 105° C., 60 sec |
| FT measurement | noted as "post strip bake" |

Two samples (Examples 1 and 2) were tested. Both samples contain 2.0 wt % total solid (polymer binder+organometal), and they differ only in the ratio of polymer binder to organometal as summarized in Table 4 below.

TABLE 4

Formulations for Examples 1 and 2 with Different Binder to Organometal Ratio

| Sample | Binder Polymer | Organometal | Diluent Solvent | Binder/ Organometal Wt Ratio |
|---|---|---|---|---|
| Ex. 1 | 30/70 HEMA/MMA | TYZOR AA-105 | PGMEA | 50/50 |
| Ex. 2 | 30/70 HEMA/MMA | TYZOR AA-105 | PGMEA | 25/75 |

Figure 1B:
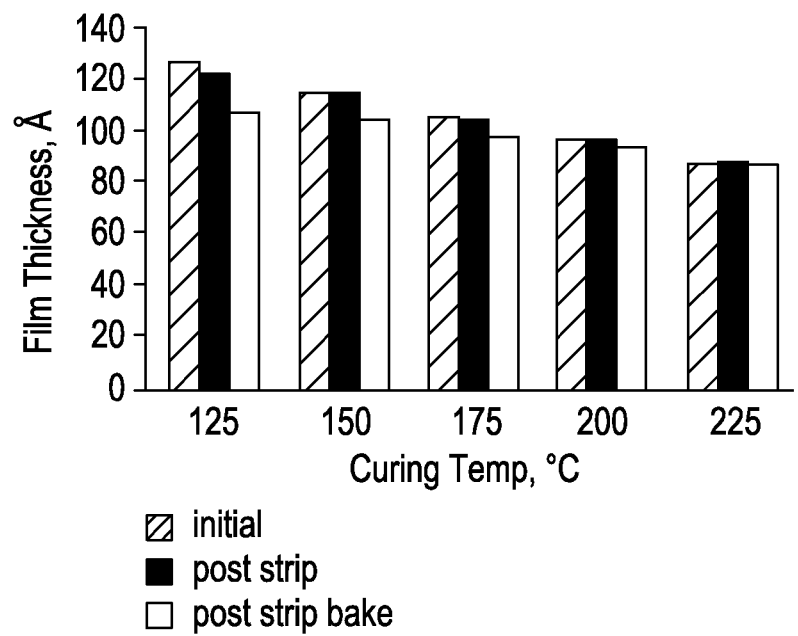

It was discovered that, although solvent resistance was stronger for a higher cure temperature, cross-linking did take place at the lowest cure temperature, 125° C., as indicated by the PGMEA stripping results shown in FIGS. 1A and 1B (Ex. 1 is depicted in FIG. 1A and Ex. 2 is depicted in FIG. 1B). In FIGS. 1A and 1B, the film thickness was measure before the strip test (initial), after the strip test (post strip), and after subjecting the stripped film to a post strip bake (post strip bake).

Figure 2:
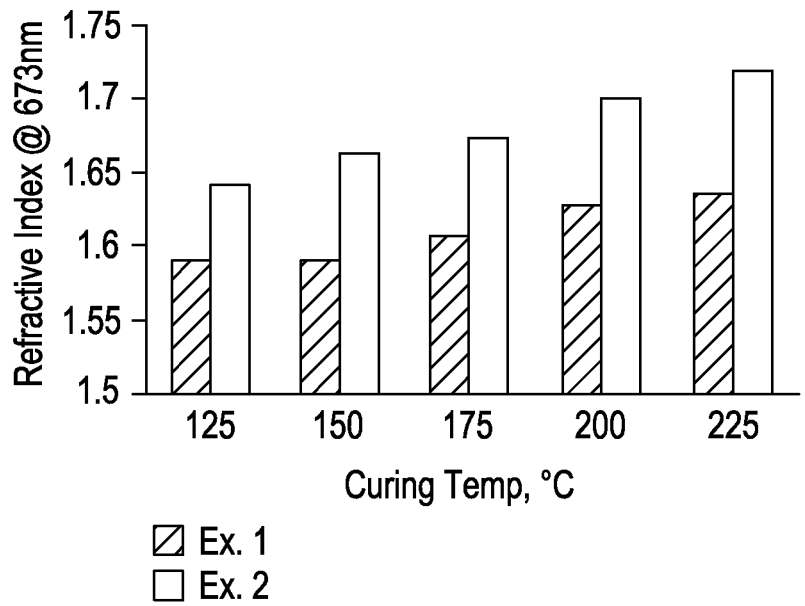
FIG. 2 depicts the "refractive index versus curing temperature" for Ex. 1 and Ex. 2.

The refractive indices (at 673 nm wavelength) of the coated films were found to steadily increase with curing temperature for both samples, indicating that the metal levels are higher in the films cured at higher temperatures. Shown in FIG. 2 are the "refractive indices versus cure temperatures." As seen in this figure, the sample (Ex. 1) with more binder polymer (binder to organometal ratio is 50/50) had a lower corresponding refractive index at each curing temperature, as compared to the sample (Ex. 2) which had a lower binder to organometal ratio (25/75).

Figure 3:
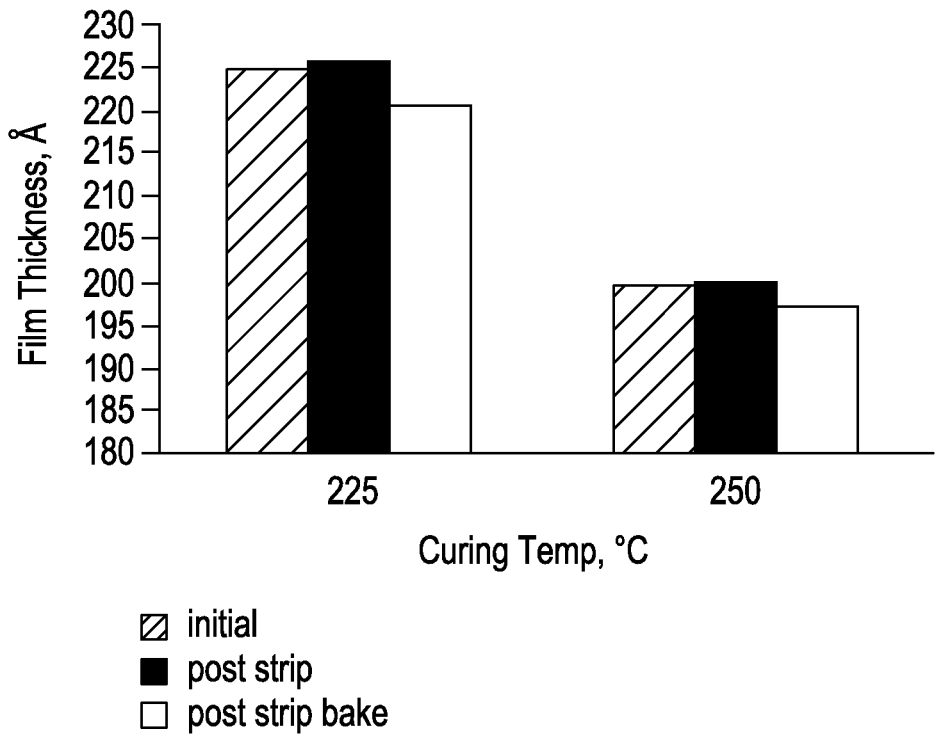
FIG. 3 depicts, for Ex. 3, at two different curing temperatures, film thickness, before and after PGMEA striping (90 sec single puddle), and after a post strip bake.

In a follow-up test, one additional sample (Ex. 3) was prepared with an increase total solid content of 6.0 wt %, by keeping the same 25/75 binder/organometal ratio as Ex. 2. The PGMEA stripping test followed the same test flow as outlined in Table 3 above, but with curing temperatures of 225 and 250° C., respectively. Results are shown in FIG. 3. In FIG. 3, the film thickness was measure before the strip test (initial), after the strip test (post strip), and after subjecting the stripped film to a post strip bake (post strip bake).

It has been discovered, as shown in FIGS. 1A, 1B and 3, that the film thickness of the cured films significantly shrinks with the increase in the curing temperature. This is believed to be due to a cross-linking reaction between the binder polymer and the organometal, and among the organometal themselves by condensing out alcohol species. Of course, evaporation of free organometal in a film cured at a higher temperature may contribute, to a certain extent, to the film shrinkage.

It has been discovered that a post coating bake at 105° C., used between the spin coating and the curing bake steps, can be used to reduce the potential of evaporation of free organometal compound. Shown in FIG. 4 are film thickness values before PGMEA striping and after post strip bake. In FIG. 4, the film thickness was measure before the strip test (initial), and after subjecting the stripped film to a post strip bake (post strip bake). Comparing FIGS. 3 and 4, one can see a slight improvement in film thickness retention is achieved with a post coating bake at 105° C. inserted between spin coating and curing bake.

The samples in FIGS. 1A, 1B and 3 were not subject to the post coating bake at 105° C. for 60 seconds. The sample in FIG. 4 was subject to this post coating bake.

Study B (Strip Test)

An additional strip test was conducted on hardmask formulations formed from "30/70 (w) HEMA/tBA" as a binder polymer. It has been discovered that the tert-butyl group on tBA is both acid and heat labile at the temperature examined. After the tert-butyl group leaves, a carboxylic acid functional group is created on the binder polymer, which reacts with organometal compound, and thus helps retain the organometal in the film. In this test set, two samples, Ex. 4 and Ex. 5, were formulated with a solid content (binder+organometal) of 6 wt %, and with, and without, a thermal acid generator (TAG) as shown in Table 5. Ex. 4 and Ex. 5 were subject to the post coating bake at 105° C. for 60 seconds. The test flow conditions are shown in Table 6 below. The results from the strip test are shown in Table 7 below.

TABLE 5

Formulations using 30/70 HEMA/tBA as a Binder Polymer and TYZOR AA-105 as an Organometal Compound

|  | Ex. 4 | Ex. 5 |
| --- | --- | --- |
| 30/70 HEMA/tBA, 10 wt % in PGMEA | 2.250 g | 2.250 g |
| TYZOR AA-105, 10 wt % in PGMEA | 6.750 g | 6.750 g |
| TAG TEA pTS, 5 wt % in HBM | — | 1.440 g |
| PGMEA | 6.00 g | 4.56 g |

TABLE 6

Process Conditions for the Stripping Test

| Spin coating | 1500 rpm |
| --- | --- |
| Post coating bake | 105° C., 60 sec |
| curing bake | 250° C., 60 sec |
| FT measurement | noted as "initial" |
| PGMEA strip | 90 sec single puddle |
| FT measurement | noted as "post strip" |
| post strip bake | 105° C., 60 sec |
| FT measurement | noted as "post strip bake" |

(FT = Film Thickness)

TABLE 7

The Strip Test Results for Ex. 4 and Ex. 5 - Film Thickness (in Å) Before PGMEA Strip (Initial), After Strip (Post Strip) and After Post Strip Bake

|  | Exp. 4 | Exp. 5 |
| --- | --- | --- |
| initial | 350.4 | 461.9 |
| post strip | 351 | 463.5 |
| post strip bake | 346.1 | 455.7 |
| reflective index @673 nm | 1.6482 | 1.6605 |

In this study, improved film retention was achieved as compared to the previous study for a formulation with the same solid (binder+organometal) content. Moreover, the formulation with TAG (Ex. 5) further improves film retention (initial and post strip film thicknesses).

Study C (Strip Test)

Poly(HEMA) was used in this study. Poly(HEMA) is not soluble in PGMEA, and therefore, it was synthesized in HBM, and used "as is." In the formulation, HBM was used as a sole solvent, as seen in Table 8 below. The solid content (binder+organometal) in the formulation is 6.0 wt %.

TABLE 8

Formulation for Ex. 6 using Poly(HEMA) as Binder Polymer and TYZOR AA-105 as the Organometal.

|  | Ex. 6 |
| --- | --- |
| Poly(HEMA), 14.7 wt % in HBM | 1.531 g |
| TYZOR AA-105, 10 wt % in HBM | 6.750 g |
| HBM solvent | 6.72 g |

The process flow is summarized in Table 9 below. Here, HBM was used as the stripping solvent rather than PGMEA, since the binder polymer in this study was not soluble in PGMEA but in HBM. Additionally, one film was subject to a post coating bake at 105° C. for 60 seconds, while the other film was not subject to the post coating bake. The film thicknesses, before and after HBM solvent stripping, and after post stripping bake, are shown in Table 10 below.

TABLE 9

A Process Flow for the Stripping Test using HBM as the Stripping Solvent

| Spin coating | 1500 rpm |
| --- | --- |
| Post coating bake | 105° C./60 sec, or no bake |
| curing bake | 250° C., 60 sec |
| FT measurement | noted as "initial" |
| HBM strip | 90 sec single puddle |
| FT measurement | noted as "post strip" |
| post strip bake | 105° C., 60 sec |
| FT measurement | noted as "post strip bake" |

TABLE 10

Film Thickness (in Å) of Formulation Ex. 6, Before
and After HBM Solvent Stripping, and After Post Stripping
Bake, and With and Without Post Coating Bake

|  | Ex. 6 with post coating bake | Ex. 6 without post coating bake |
|---|---|---|
| initial | 893.9 | 871.8 |
| post strip | 896.5 | 874.6 |
| post strip bake | 886.8 | 866.6 |
| reflective index @673 nm | 1.6215 | 1.6196 |

With the same (6 wt %) total solid (binder+organometal) content as Ex. 4, the film thickness of Ex. 6 is significantly increased (from 350 to 894 Å). This increase in film thickness is not only because of increased number of hydroxy groups that promote cross-linking between the binder polymer and the organometal, but also because of the increased solution viscosity due to HBM solvent. For the films of Example 6, the film with post coating bake is thicker than the film without this bake step.

Study D (Use Different Organometal)

In this study, the binder polymer, "30/70 (w) HEMA/IP-GMA," was used in the formulations, along with organometal compound, AA-105-IPG. Both materials are acid labile, and upon baking, hydroxy groups are generated. These generated hydroxy groups on binder polymer and on organometal compound further react with organometal compound during baking, to help retain the organometal in a coated film.

Two formulations were made with TAG, and both formulations contain 6 wt % solid (bonder+organometal). TYZOR AA-105 was used in one formulation, and AA-105-IPG was used in another formulation. The detailed formulations are listed in Table 11. Both examples Ex. 7 and Ex. 8 formed excellent films with film thickness of 517 and 456, respectively.

TABLE 11

Formulations for Ex. 7 and Ex. 8.

|  | Ex. 7 | Ex. 8 |
|---|---|---|
| 30/70 HEMA/IPGMA Stock | 2.250 g | 2.250 g |
| AA-105-IPG stock solution | 6.750 g | — |
| TYZOR AA-105 stock solution | — | 6.750 g |
| TAG TEA pTS stock solution | 1.440 g | 1.440 g |
| PGMEA | 4.56 g | 4.56 g |

Study E (Strip Test—Zirconium Butoxide)

Zirconium butoxide was used in this study with "30/70 (w) HEMA/MMA" as a binder polymer. The detailed formulation is given in Table 12 below. The test conditions are shown in Table 13. Ex. 9 was subject to the "105 C/60 sec post coating bake." A similar test flow to Study B was used, but with a higher curing temperature of 350° C. for 90 seconds.

TABLE 12

Metal Hardmask Formulation Based on 30/70 HEMA/MMA
Binder Polymer and Zirconium Butoxide Organometal

| Examples | 30/70 HEMA/MMA 10.0 wt % in PGMEA | Zirconium butoxide 25.0 wt % in PGMEA/1-butanol | HBM solvent |
|---|---|---|---|
| Ex. 9 | 2.250 g | 2.700 g | 10.05 g |

TABLE 13

Process Conditions for the Stripping Test

| Spin coating | 1500 rpm |
|---|---|
| Post coating bake | 105° C., 60 sec |
| curing bake | 350° C., 90 sec |
| FT measurement | noted as "initial" |
| PGMEA strip | 90 sec single puddle |
| FT measurement | noted as "post strip" |
| post strip bake | 105° C., 60 sec |
| FT measurement | noted as "post strip bake" |

(FT = Film Thickness)

The film thicknesses before and after PGMEA strip, and after strip bake, are listed in Table 14. Again, excellent resistance to solvent is observed for this zirconium based organometal compound.

TABLE 14

Film Thicknesses (Å) of Ex. 9 Before (Initial) and After
(post Strip) PGMEA Strip, and After Strip Bake (Post Strip Bake)

|  | Exp. 9 |
|---|---|
| initial | 613.6 |
| post strip | 614.6 |
| post strip bake | 611.5 |
| reflective index @673 nm | 1.537 |

Study F (Strip Test—Alcohol Solvent)

Formulations with alcohol as a major solvent were studied. The "30/70 (w) HEMA/tBA" synthesized in MIBC, was used as the binder polymer. TYZOR AA-105 was used as the organometal compound, and 2-methyl-1-butanol was used as the major solvent in the formulations. The formulations further contain different levels of TAG. Shown in Table 15 are the detailed formulations for a curing temperature study. Ex. 10 contained 14.0 wt % solid (binder+organometal), Ex. 11 contained 13.3 wt % solid, and Ex. 12 contained 12.9 wt % solid. The coated films were cured at 350° C. for 90 seconds, using the test conditions shown in Table 16. These examples were subject to the "105 C/60 sec post coating bake." The film thicknesses are shown in Table 17.

TABLE 15

Metal Hardmask Formulation Based on 30/70 (w) HEMA/tBA Binder
Polymer and TYZOR AA-105 using Alcohol as a Major Solvent

| Examples | 30/70 (w) HEMA/tBA 39.8 wt % in MIBC | TYZOR AA-105 25.0 wt % in 2-methyl-1-butanol | TAG TEA pTS 5 wt % in HBM | 2-methyl-1-butanol solvent |
|---|---|---|---|---|
| Ex. 10 | 3.5176 g | 16.800 g | 0 | 19.68 g |
| Ex. 11 | 3.342 g | 15.960 g | 1.366 g | 19.33 g |
| Ex. 12 | 3.241 g | 15.480 g | 2.120 g | 15.16 g |

TABLE 16

Process Conditions for the Stripping Test

| Spin coating | 1500 rpm |
|---|---|
| Post coating bake | 105° C., 60 sec |
| curing bake | 350° C., 90 sec |
| FT measurement | noted as "initial" |
| PGMEA strip | 90 sec single puddle |
| FT measurement | noted as "post strip" |
| post strip bake | 105° C., 60 sec |
| FT measurement | noted as "post strip bake" |

(FT = Film Thickness)

TABLE 17

Film thicknesses (Å) of Ex. 10, 11 and 12
before and after PGMEA strip and after strip bake

|  | Exp. 10 | Exp. 11 | Exp. 12 |
|---|---|---|---|
| initial | 642.7 | 635.7 | 634.9 |
| post strip | 643.9 | 635.7 | 637.8 |
| post strip bake | 643.2 | 635.2 | 637.6 |

Figure 5B:
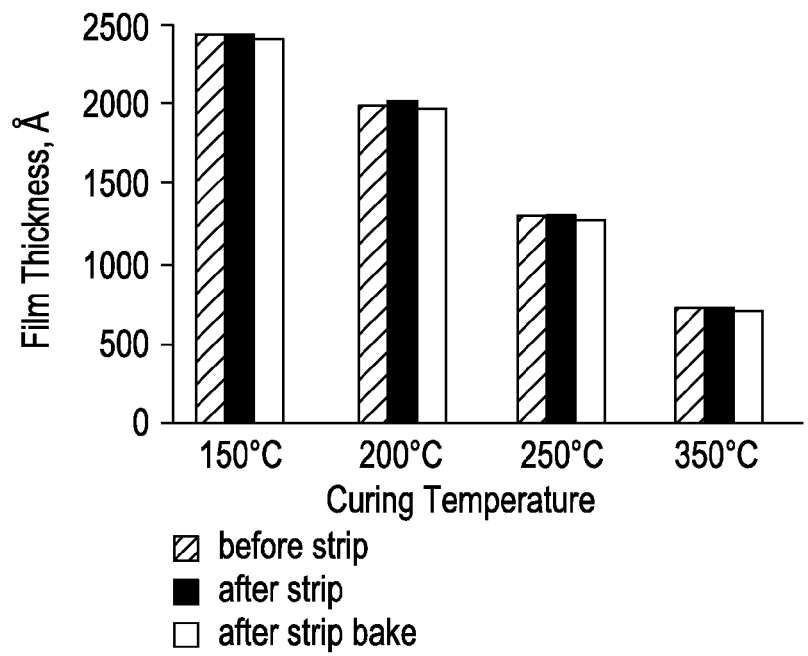
Figure 5C:
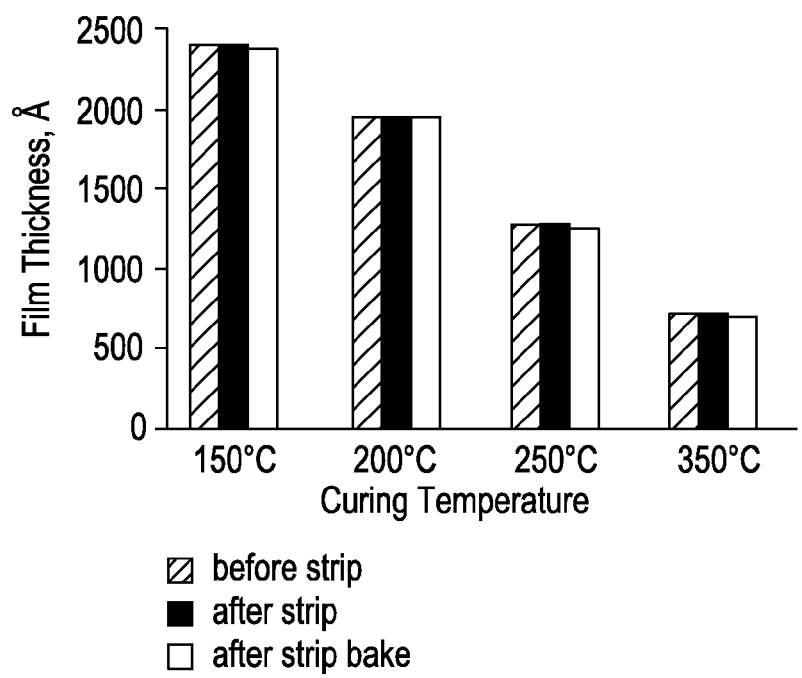
Figure 6:
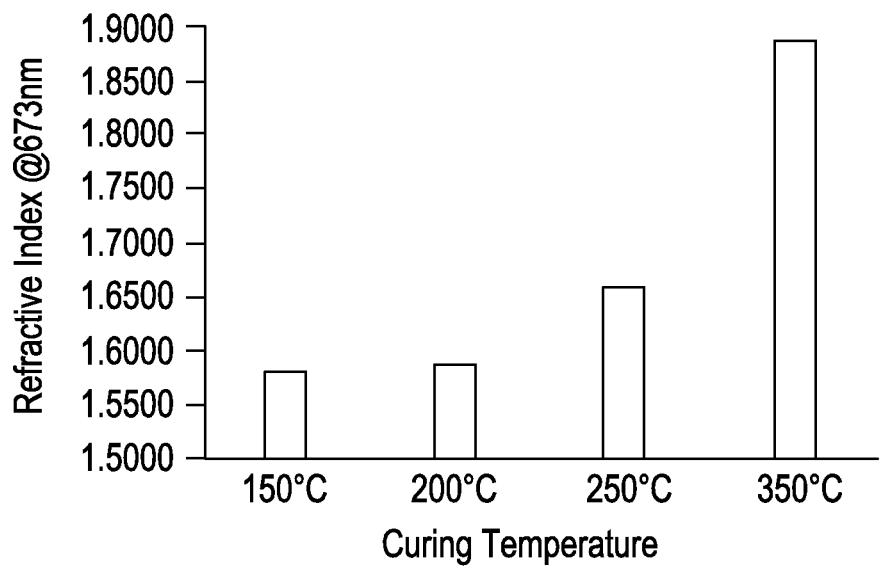
FIG. 6 depicts refractive indices of cured films (Ex. 10) at different curing temperatures.

As seen in Table 17, excellent solvent resistance is demonstrated by all these three formulations When tested at different curing temperatures, following test conditions shown in Table 18, these three formulations (Exs. 10-12) exhibited excellent solvent resistance across the curing temperature used (see FIGS. 5A (Ex. 10), 5B (Ex. 11) and 5C (Ex. 12)). The refractive indices of cured films were found to increase dramatically with the increase of curing temperature. See FIG. 6 for Ex. 10

TABLE 18

Process Conditions for the Stripping Test

| | |
|---|---|
| Spin coating | 1500 rpm |
| Post coating bake | 105° C., 60 sec |
| curing bake | 150, 200, 250 and 350° C., for 60 sec |
| FT measurement | noted as "initial" |
| PGMEA strip | 90 sec single puddle |
| FT measurement | noted as "post strip" |
| post strip bake | 105° C., 60 sec |
| FT measurement | noted as "post strip bake" |

(FT = Film Thickness)

VI. Thermal Stability—Overview

Thermal stability of a cured metal hardmask film was measured by the change in film thickness before and after a baked at 250° C. for 10 minutes. A film thickness change of less than, or equal to, 5% is acceptable.
Study A: 30/70 (w) HEMA/MMA with TYZOR AA-105

In this study, Ex. 3 was tested by curing it at 350° C. for 60 and 90 seconds, respectively. The detailed test flow, including the post coating bake, is listed in Table 19. The film thicknesses before and after a "250° C./10 min bake" are listed in Table 20 below.

TABLE 19

Process Conditions for the Stripping Test

| | |
|---|---|
| Spin coating | 1500 rpm |
| Post coating bake | 105° C., 60 sec |
| curing bake | 350° C., for 60 sec or 90 sec |
| FT measurement | noted as "before" |
| Thermal stability test bake | 250° C., for 10 min |
| FT measurement | noted as "after" |

(FT = Film Thickness)

TABLE 20

Film Thicknesses (Å) of Ex. 3 Before
and After 250° C./10 min Bake

| Ex. 3 | Cured at 350° C., for 60 sec | Cured at 350° C., for 90 sec |
|---|---|---|
| before | 234.8 | 205.7 |
| after | 229.6 | 202.3 |
| % change | 2.21% | 1.65% |

Excellent thermal stability was demonstrated with this formulation when cured at 350° C., for either 60 or 90 seconds.

Study B: 30/70 (w) HEMA/tBA with TYZOR AA-105

In this study, Ex. 10, Ex. 11 and Ex. 12 were tested using the same test flow as outlined in Table 19 above, but for curing at 350° C., for 60 seconds only. The film thicknesses, before and after coated films were baked at 250° C., for 10 minutes, are summarized in Table 21 below. Excellent thermal stability was demonstrated with these three formulations with and without a TAG.

TABLE 21

Film Thicknesses (Å) of Ex. 3 Before
and After 250° C./10 min Bake

| Ex. 3 | Ex. 10 | Ex. 11 | Ex. 12 |
|---|---|---|---|
| before | 694.2 | 686.5 | 735.4 |
| after | 671.7 | 664.2 | 710.9 |
| % change | 3.24% | 3.25% | 3.33% |

VII. Etch Resistance—Overview

Etch resistance of a cured metal hardmask was evaluated by the change in film thickness before and after etched, in a given time frame, using a specified etch chemistry. In this test, both $O_2$ and $CF_4$ etch gasses were used, with a etch power of 90 W and 50 W, respectively. Etch time was 10 to 30 seconds, depending on the test film thickness. The etch tool was a PLASMA-THERM 790 RIE, which contained a sample holder for the coated wafer (sample size (0.5 in×1 in) cut from a whole wafer). The film thickness before and after etch was measured using a microspectrophotometer NANOSPEC AFT 2100 from Nanometrics.
Study A: Enhanced Etch Resistance with Increased Organometal Level in a Film In this study, samples with different levels of TYZOR AA-105 were formulated with the "30/70 (w) HEMA/MMA" binder polymer, as summarized in Table 22. Solvent in these formulations was PGMEA. The formulations are detailed in Table 23 below.

TABLE 22

Formulations with Different Levels of TYZOR AA-105.

|  | Ex. 13 | Ex. 14 | Ex. 15 | Ex. 16 | Ex. 17 |
|---|---|---|---|---|---|
| Binder content in formulation (wt % based on weight of formulation) | 5.0 wt % | 4.0 wt % | 3.5 wt % | 3.0 wt % | 2.5 wt % |
| TYZOR AA-105/binder wt ratio | 0 | 25/70 | 50/50 | 75/25 | 85/15 |

TABLE 23

Formulation Detailed for Ex. 13 Through Ex. 17.

|  | Ex. 13 | Ex. 14 | Ex. 15 | Ex. 16 | Ex. 17 |
|---|---|---|---|---|---|
| 30/70 HEMA/MMA, 10.0 wt % in PGMEA | 5.088 g | 4.064 g | 3.556 g | 3.047 g | 2.541 g |
| TYZOR AA-105, 20 wt % in PGMEA | 0 | 0.667 g | 1.727 g | 4.517 g | 7.080 g |
| PGMEA | 4.919 g | 5.225 g | 4.687 g | 2.564 g | 0.376 g |

Each sample was spin coated on a bare silicon wafer at 1500 rpm, followed by a post coating bake at 105° C. for 60 seconds, and then cured at 250° C. for 60 seconds. The etch rates of these coated films were determined using a PLASMA-THERM 790 RIE system with a etching power of 90 w for O₂ etch (for 30 seconds) and 50 w for CF₄ etch (for 25 seconds). Results are summarized in Tables 24 and 25.

TABLE 24

Film Thickness (Å) Before and After O₂ Etch

| O₂ Etch Results | Ex. 13 | Ex. 14 | Ex. 15 | Ex. 16 | Ex. 17 |
|---|---|---|---|---|---|
| Initial FT, Å | 289 | 292 | 371 | 574 | 788 |
| FT after 30 s O₂ Etch, Å | 0 | 111 | 276 | 535 | 739 |
| O₂ Etch Rate, Å/sec | >28.9 | 6.0 | 3.2 | 1.3 | 1.6 |

TABLE 25

Film Thickness (Å) Before and After CF₂ Etch

| CF₄ Etch Results | Ex. 13 | Ex. 14 | Ex. 15 | Ex. 16 | Ex. 17 |
|---|---|---|---|---|---|
| Initial FT, Å | 289 | 292 | 371 | 574 | 788 |
| FT after 25 s CF₄ Etch, Å | 167 | 167 | 283 | 525 | 734 |
| CF₄ Etch Rate, Å/sec | 4.9 | 5.0 | 3.5 | 2.0 | 2.2 |

Figure 7:
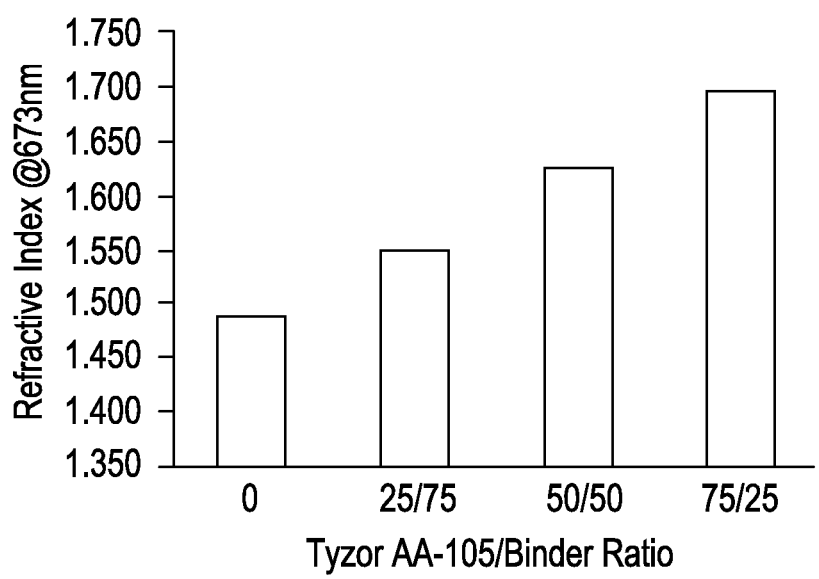
FIG. 7 depicts refractive indices of coated films at different levels of organometal (TYZOR AA-105).

As seen from Tables 24 and 25, a significant decrease in etch rate was obtained with incorporation of TYZOR AA-105 in the coated film. It was discovered that, unlike "Si-containing films," the inventive films can sustain CF₄ etch, and therefore an etch selectivity can be created between the inventive films and the "Si-containing films," such as a silicon hardmask or a SiARC. In addition, this group of samples showed an increasing trend in refractive indices at 673 nm wavelength with increasing organometal levels in the coated film, as shown in FIG. 7 (EXS. 13-16).

VIII. Metal Hardmask Lithography Test

The lithography test was used to test the bottom antireflective coating (BARC) property of the metal hardmask. In this test, an inventive metal hardmask was tested in a dual BARC stack, by replacing the bottom BARC in the stack with the metal hardmask. Lithography performance was compared between the original dual BARC stack and the stack with the inventive metal hardmask. The lithography processing conditions are listed in Table 26 below. For lithography test, the samples were processed on an ASML 1900i Immersion Scanner in conjunction with a CLEAN TRACK LITHIUS. The small volume dispensing device was a TRDACK. The dispensing volume for each layer was 1 to 3 ml. The spin speed was around 1500 RPM to obtain the target film thicknesses. AR26N is an bottom antireflective coating available from Dow Electronic Materials. AR137 is an bottom antireflective coating available from Dow Electronic Materials.

TABLE 26

Processing Conditions for Metal Hardmask Ex. 11 Lithography Test

| BARC 1 | AR26N | Ex. 11 |
|---|---|---|
| thickness* bake temp, time | 760 Å 205° C., 60 sec | 730 Å 350° C., 60 sec |
| BARC 2 | AR137 | AR137 |
| thickness* bake temp, time | 200 Å 205° C., 60 sec | 200 Å 205° C., 60 sec |
| Resist | EPIC2096 | EPIC2096 |
| thickness* soft bake temp, time | 1100 Å 120° C., 60 sec | 1100 Å 120° C., 60 sec |
| Top Coat | OC2000 | OC2000 |
| thickness* bake temp, time | 314 Å 90° C., 60 sec | 314 Å 90° C., 60 sec |
| Illumination | Dipole 35-Y | Dipole 35-Y |
| Polarization | X | X |
| NA | 1.35 | 1.35 |
| Outer Sigma | 0.96 | 0.96 |
| Inner Sigma | 0.76 | 0.76 |

*Thickness of individual layer

Figure 8:
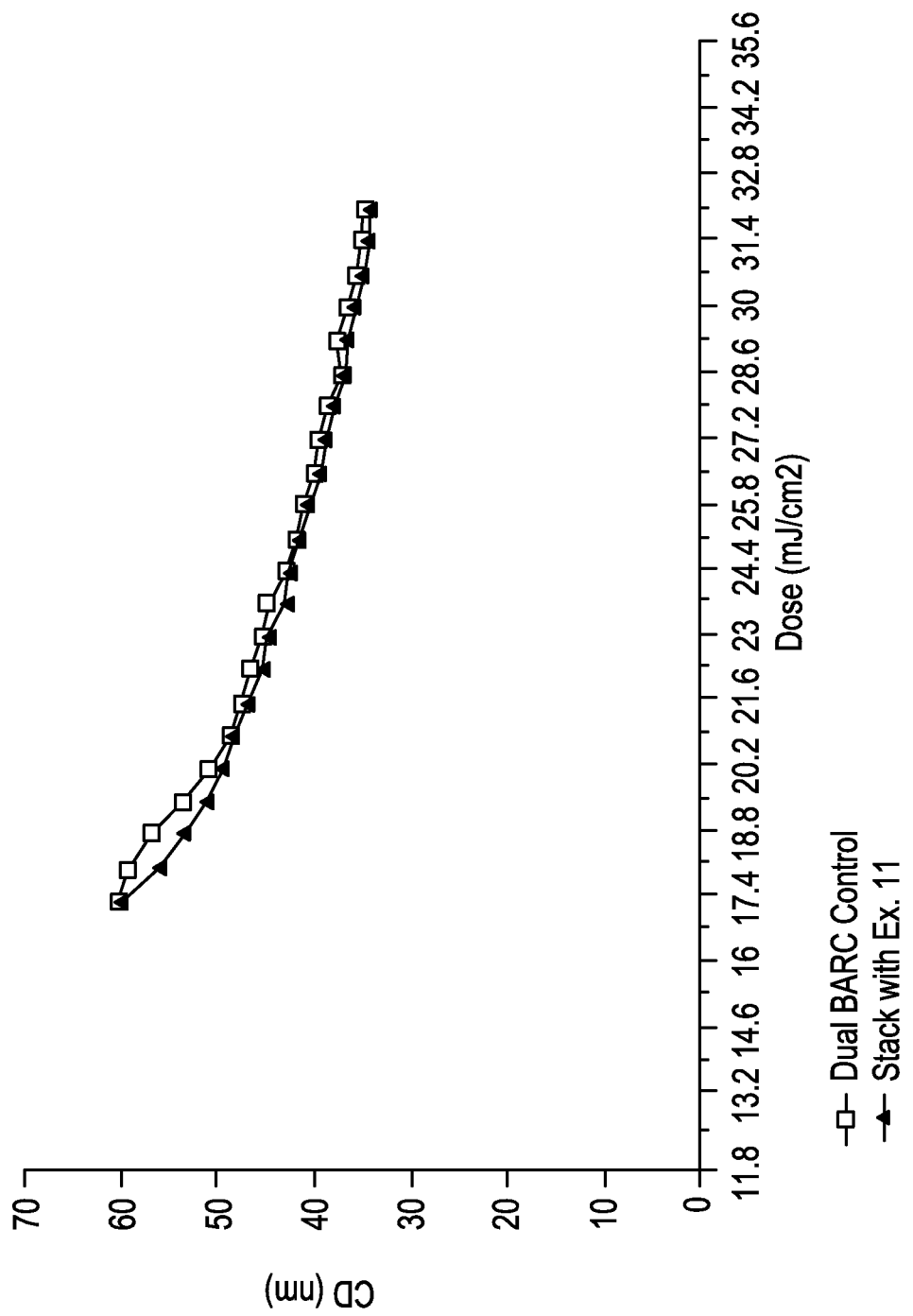
FIG. 8 depicts overlaid "CD through dose" plots for original dual BARC stack and the stack with Ex. 11 metal hardmask.

This lithography test was for imaging "42 nm 1:1 line-space" patterns using EPIC 2096 resist (available from Dow Electronic Materials). In this test, OC 2000 immersion top coat (available from Dow Electronic Materials) was also used. An ASML 1900i scanner at a maximum scan speed of 650 mm/sec was used. Shown in FIG. 8 are "critical dimension (CD) versus dose (exposure energy)" plots for the stack with the Ex. 11 metal hardmask and the stack of the original dual BARC system.

The following test results: $E_{size}$ (exposure energy for printing the target "42 nm 1:1 line-space"), energy latitude (EL) and pattern collapse margin (PCM), are summarized in Table 27.

TABLE 27

Summary Table for Litho Performance

| | Dual BARC | Stack with Ex. 11 |
|---|---|---|
| Esize, mJ/cm² | 25.9 | 24.1 |
| EL, % | 24.4 | 24.4 |
| PCM, nm | 34.5 | 34.5 |

As seen in Table 27, the stack containing the BARC formed from Ex. 11 had a similar performance, compared to the stack containing the original dual BARC system. The "CD through dose," at best focus, for "42 nm/84 nm" pitch lines is shown in FIG. 9. A direct comparison for the images at Esize (energy for printing the target CD, 42 nm in this test) and best focus, is shown in FIG. 10 below.

A slightly improved LWR was seen for the stack with Ex. 11 as the bottom BARC. Esize for the stack with Ex. 11 was slightly reduced as observed in this test. Overall, similar lithography performance was achieved with formulation Ex. 11 in a dual BARC stack, as compared to the original dual BARC stack.

The invention claimed is:

1. A composition comprising at least the following A and B:
   A) a polymer comprising, in polymerized form, at least one monomer that comprises at least one hydroxyl group; and
   B) an organometal compound comprising at least one metal selected from Ti, Zr, Hf, Co, Mn, Zn, or combinations thereof, and wherein the organometal compound is present in an amount greater than 50 weight percent, based on the sum weight of A and B; and wherein the monomer that comprises at least one hydroxyl group is selected from HEMA, OH-styrene, or combinations thereof.

2. The composition of claim 1, wherein the polymer of component A comprises less than 1 weight percent silicon, based on the weight of the polymer.

3. The composition of claim 1, wherein component A is present in an amount greater than 20 weight percent, based on the sum weight of A and B.

4. The composition of claim 1, wherein component B is present in an amount less than 80 weight percent, based on the sum weight of A and B.

5. The composition of claim 1, wherein the polymer of component A comprises from 5 to 100 weight percent of the monomer that comprises at least one hydroxyl group based on the weight of the polymer.

6. The composition of claim 1, wherein the polymer further comprises an acrylate, a methacrylate, or an ethacrylate.

7. The composition of claim 1, wherein the organometal compound is chelated with at least two oxygen atoms.

8. The composition of claim 1, wherein the metal of the organometal compound is selected from Ti, Zr, or combinations thereof.

9. The composition of claim 1, wherein the organometal compound is selected from the following compounds:

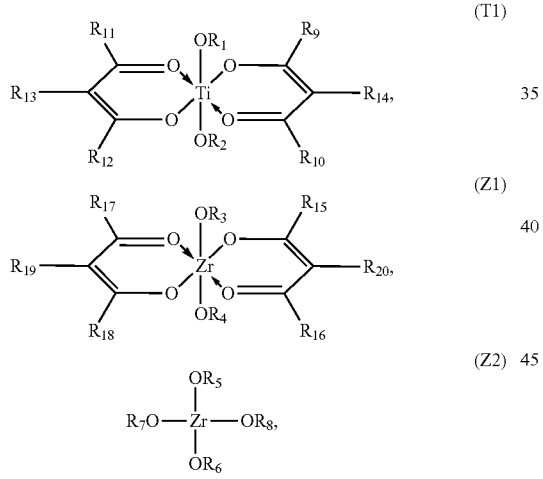

or combinations thereof, and
wherein R1, R2, R3, R4, R5, R6, R7 and R8 are each independently selected from the following:
i) hydrocarbon group,
ii) a substituted hydrocarbon group,
iii) a hydrocarbon group containing at least one heteroatom in its backbone, or
iv) a substituted hydrocarbon group containing at least one heteroatom in its backbone; and wherein R9, R10, R11, R12, R13, R14, R15, R16, R17, R18, R19 and R20 are each independently selected from the following:
i) a hydrogen atom,
ii) a hydrocarbon group,
iii) a substituted hydrocarbon group,
iv) a hydrocarbon group containing at least one heteroatom in its backbone, or
v) a substituted hydrocarbon group containing at least one heteroatom in its backbone.

10. A chelated metal compound formed from the composition of claim 1, and comprising at least one ligand derived from the polymer of component A.

11. An article comprising at least one component formed from the composition of claim 1.

12. The article of claim 11, wherein the article is an electronic device.

13. A method of forming a coated substrate, said method comprising at least the following:
a) applying the composition of claim 1 over at least a portion of the substrate,
b) thermally treating the composition to form the coating.

14. The article of claim 11, wherein the article is a metal hardmask.

15. A composition comprising at least the following A and B:
A) a polymer comprising, in polymerized form, at least one monomer that comprises at least one hydroxyl group; and
B) an organometal compound comprising at least one metal selected from Ti, Zr, Hf, Co, Mn, Zn, or combinations thereof, and
wherein the organometal compound is present in an amount greater than 50 weight percent, based on the sum weight of A and B; and
wherein the monomer that comprises at least one hydroxyl group is selected from OH-acrylate, OH-methacrylate or OH-ethacrylate.

16. A composition comprising at least the following A and B:
A) a polymer comprising, in polymerized form, at least one monomer that comprises at least one hydroxyl group; and
B) an organometal compound comprising at least one metal selected from Ti, Zr, Hf, Co, Mn, Zn, or combinations thereof, and
wherein the organometal compound is present in an amount greater than 50 weight percent, based on the sum weight of A and B; and
wherein the polymer further comprises an acrylate, a methacrylate, or an ethacrylate.

17. An article comprising at least one component formed from the composition of claim 15.

18. The article of claim 17, wherein the article is an electronic device.

19. An article comprising at least one component formed from the composition of claim 16.

20. The article of claim 19, wherein the article is an electronic device.

* * * * *